US006818556B2

(12) United States Patent
Uozumi

(10) Patent No.: US 6,818,556 B2
(45) Date of Patent: Nov. 16, 2004

(54) METHOD OF PLATING A METAL OR METAL COMPOUND ON A SEMICONDUCTOR SUBSTRATE THAT INCLUDES USING THE SAME MAIN COMPONENT IN BOTH PLATING AND ETCHING SOLUTIONS

(75) Inventor: Yoshihiro Uozumi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/233,582

(22) Filed: Sep. 4, 2002

(65) Prior Publication Data

US 2003/0001271 A1 Jan. 2, 2003

Related U.S. Application Data

(60) Continuation of application No. 09/865,569, filed on May 29, 2001, now Pat. No. 6,475,909, which is a division of application No. 09/494,025, filed on Jan. 31, 2000, now Pat. No. 6,261,953.

(30) Foreign Application Priority Data

Jan. 25, 2000 (JP) ........................................ 2000-015653

(51) Int. Cl.[7] ............................................ H01L 21/445
(52) U.S. Cl. ........................ 438/687; 438/686; 438/705; 438/754
(58) Field of Search .................... 427/19.2; 438/674, 438/686, 687, 695, 705, 754

(56) References Cited

U.S. PATENT DOCUMENTS

| 3,784,669 A | 1/1974 | Elges, III et al. |
| 4,428,773 A | 1/1984 | Krotz |
| 4,452,643 A | 6/1984 | Martin et al. |
| 5,081,562 A * | 1/1992 | Adachi et al. ............... 361/764 |
| 5,111,335 A * | 5/1992 | Horiuti et al. .............. 359/350 |
| 5,151,168 A | 9/1992 | Gilton et al. |
| 5,186,811 A * | 2/1993 | Otani et al. .................. 205/125 |
| 5,409,567 A | 4/1995 | Lytle et al. |
| 5,567,244 A | 10/1996 | Lee et al. |
| 5,789,320 A | 8/1998 | Andricacos et al. |
| 6,124,204 A | 9/2000 | Lan et al. |
| 6,132,587 A * | 10/2000 | Jorne et al. .................. 205/123 |
| 6,194,032 B1 | 2/2001 | Svedberg et al. |
| 6,261,433 B1 * | 7/2001 | Landau ......................... 205/96 |
| 6,261,953 B1 * | 7/2001 | Uozumi ...................... 438/687 |
| 6,391,770 B2 * | 5/2002 | Kosaki et al. .............. 438/650 |

FOREIGN PATENT DOCUMENTS

| JP | 2-306631 | 12/1990 |
| JP | 8-12327 A | 1/1996 |
| JP | 8-70178 A | 3/1996 |
| JP | 10-233397 | 9/1998 |

* cited by examiner

Primary Examiner—Erik Kielin
Assistant Examiner—Stephen W. Smoot
(74) Attorney, Agent, or Firm—Finnegan, Henderson, Farabow, Garrett & Dunner, L.L.P.

(57) ABSTRACT

A method of forming a copper oxide film includes forming a copper oxide film including an ammonia complex by causing a mixed solution of aqueous ammonia and aqueous hydrogen peroxide, which has been adjusted to have pH of 8 to 10 or pH of 9 to 10, to contact a surface of a copper film. A method of fabricating a semiconductor device includes burying a copper film to be a wiring or a contact wiring in a wiring groove or a contact hole formed in a surface of an insulating film formed on a semiconductor substrate, or in both the wiring groove and the contact hole, forming a copper oxide film including an ammonia complex on a surface of the copper film by using the copper oxide film forming method, and removing the copper oxide film from the copper film using acid or alkali.

20 Claims, 9 Drawing Sheets

METHOD OF PLATING A METAL OR METAL COMPOUND ON A SEMICONDUCTOR SUBSTRATE THAT INCLUDES USING THE SAME MAIN COMPONENT IN BOTH PLATING AND ETCHING SOLUTIONS

This is a continuation of Application No. 09/865,569, filed May 29, 2001, now U.S. Pat. No. 6,475,909, which is a division of Application No. 09/494,025 filed Jan. 31, 2000, now U.S. Pat. No. 6,261,953, all of which are which are incorporated in their entirety herein by reference.

CROSS-REFERENCE TO RELATED APPLICATION

This application is based upon and claims the benefit of priority under 35 U.S.C. §119(a)-(d) based on Japanese Patent Application No. 2000-015653, filed Jan. 25, 2000.

BACKGROUND OF THE INVENTION

The present invention relates to a semiconductor device such as a semiconductor integrated circuit, a method of processing a copper film to be used for wirings for a semiconductor device such as a semiconductor integrated circuit and a method of producing a wiring structure for such a semiconductor device.

Today, copper or a material essentially consisting of copper is used for wirings for a semiconductor device such as a semiconductor integrated circuit. In such a case, copper atoms are diffused into an insulating film to enter the semiconductor substrate, which may result in malfunction of transistors. To prevent it, a barrier metal layer of a titanium nitride, tantalum nitride, tungsten nitride or the like is often formed around the copper film to isolate the copper film from the insulating film.

As shown in FIG. 13A which is a cross-sectional view showing the structure of a semiconductor substrate, wirings formed on a semiconductor substrate are normally buried in wiring grooves in an insulating film. An inter-layer insulating film 101 is formed of silicon oxide on a semiconductor substrate 100 of silicon or the like where a semiconductor element (not shown) such as an integrated circuit is formed, and wiring grooves are formed in the surface of this inter-layer insulating film 101. A barrier metal layer 102 of TiN, TaN or the like is formed on the side wall of each wiring groove and a copper film 103 or an alloy film essentially consisting of copper is buried in the region surrounded by the barrier metal layer 102.

Apparently, the conventional wiring may cause copper in the wiring portion to be diffused into the inter-layer insulating film 101 from a portion where there is no barrier metal, i.e., from above, thereby adversely affecting the semiconductor element formed on the semiconductor substrate 100. As the surfaces of the inter-layer insulating film 101 and the copper film 103 buried therein are planarized by CMP or the like, the pattern edges may not be detected at the time of implementing lithography, which may lead to deviation in the wiring pattern.

Those shortcomings can be dealt with by selling back the wiring portion or the copper film 103 from the surface of the inter-layer insulating film by etching (FIG. 13B). Making such a shape can provide accurate pattern alignment.

There may be a case where a barrier metal layer 104 may be buried in the recessed portion to cover the copper film 103 as shown in FIG. 13C. This structure has an advantage of suppressing the diffusion of copper from above the wiring. Further, forming the cap layer of a conductive material prevents copper from being placed in the etching environment at the time a via wiring (contact wiring) to the over-lying wiring is formed. This can reduce the possible occurrence of corrosion or etching-originated wiring disconnection.

The above-described conventional wiring structures are formed by two methods: wet etching and dry etching. Dry etching includes anisotropic etching called RIE (Reactive Ion Etching) and isotropic etching called CDE (Chemical Dry Etching), both of which can etch copper. Those dry etching processes often use CF-based gas as the source gas, which adversely affect the environment of the earth. Further, because a by-product is deposited after etching, a wet process for removing the by-product is often performed so that dry etching is disadvantageous over wet process in the number of steps as well as the cost.

In this aspect, attention is being paid to wet etching. Copper is hardly dissolved in a weak acid which has a weak oxidizing property, such as hydrochloric acid, hydrofluoric acid, dilute sulfuric acid, acetic acid, hydrocyanic acid, or the like, however it is etched by an acidic chemical solution which has an oxidizing property. Specifically, such acidic chemical solutions include thermal concentrated sulfuric acid, nitric acid, nitrous acid, phosphoric acid and the like. Copper is also soluble in an acid solution which is formed by mixing acid with aqueous hydrogen peroxide, ozone or oxygen, such as hydrochloric acid+aqueous hydrogen peroxide, hydrochloric acid+aqueous ozone or hydrofluoric acid+aqueous hydrogen peroxide. Further, copper is also etched by a material which forms a soluble complex with copper, such as ammonia, a material having an amino group (ethylene diamine or the like), cyanide (KCN or the like). Etching is often accelerated by mixing aqueous hydrogen peroxide or the like with those materials to provide an oxidizing property.

Normally, a mixed solution of aqueous ammonia and aqueous hydrogen peroxide and a mixed solution of hydrochloric acid and aqueous hydrogen peroxide are used as cleaning chemical solutions and are respectively called SC1 and SC2. The concentrations of aqueous ammonia, hydrochloric acid and aqueous hydrogen peroxide available on the market are often about 20 to 35%, and SC1 and SC2 are usually mixed with pure water in the volume ratio of about 1:1:5 to 1:1:7. As copper is dipped into the solution mixed under the above condition, it is etched.

When copper is etched with SC1 or SC2 under the aforementioned condition, however, the copper surface having a metallic gloss becomes whitened and loses gloss. Etching copper with any of the aforementioned chemical solutions such as nitric acid and thermal concentrated sulfuric acid also causes the whitening phenomenon. This phenomenon becomes more prominent unless the temperature of the solution is raised. Whitening of the surface of copper occurs as etching roughens the copper surface. If this copper is used for wirings and the surface roughness becomes larger, a variation in film thickness or the surface scattering may increase the substantial resistance or result in contact failure to the over-lying wiring. It is therefore necessary to perform etching under such a condition as not to roughen the copper surface as much as possible.

Another way of etching copper is to oxidize a copper film and then remove the copper oxide using acid or the like. For example, Jpn. Pat. Appln. KOKAI Publication No. 2-306631 proposes a method of carrying out implantation of oxygen ions in a copper film and then annealing the resultant structure or subjecting the structure to an oxygen plasma treatment to form a copper oxide, and then etching the copper oxide with diluted sulfuric acid or acetic acid. In addition, Jpn. Pat. Appln. KOKAI Publication No. 10-233397 proposes a method of placing a copper film in the environment of oxygen ($O_2$) or ozone ($O_3$) in a diffusion furnace, an RTA furnace or an oven at room temperature or higher to thereby form a copper oxide film and then removing the copper oxide film by wet etching using diluted hydrochloric acid or diluted sulfuric acid, or dry etching or CMP. Those schemes however often cause copper to have a rough surface after etching. Particularly, this tendency becomes more noticeable as the temperature is increased to make the oxide film thicker.

BRIEF SUMMARY OF THE INVENTION

Accordingly, it is an object of the present invention to provide a method of forming a copper oxide film, a method of etching a copper film, a method of fabricating a semiconductor device, and a semiconductor device, which suppress roughening of the surface of a copper film after performing an etching process of oxidizing the copper film and removing the copper oxide with acid, alkali or the like, and allow the etching process to be implemented in fewer steps and quickly at a high precision.

This invention is characterized in that, in forming a copper wiring, copper is placed in a mixed solution (SC1) of aqueous ammonia and aqueous hydrogen peroxide, which has been adjusted to have pH of 8 to 10, thereby forming a copper oxide film including an ammonia complex on the surface of the copper, after which the copper oxide film is selectively etched with acid having a weak oxidizing property such as diluted hydrochloric acid or alkali such as diluted aqueous ammonia. To shorten the etching time, after copper is dipped in the mixed solution of pH of 8 to 10 to form an oxide film, the copper is dipped in SC1 which has been adjusted to have pH of 10 to 11 which would normally etch copper, thereby forming a thicker copper oxide film including an ammonia complex, which is then selectively etched with acid having a weak oxidizing property such as hydrochloric acid or alkali such as diluted aqueous ammonia. Copper oxide film can be selectively etched even with liquid which dissolves copper by forming complex with copper, though the liquid is neutral as an aqueous solution of neutral amino acid such as glycine or alanine.

Such formation of an oxide film and such etching can permit copper to be etched without roughening the copper surface which has conventionally been difficult to achieve, can ensure quick oxidation and etching with a safe and inexpensive chemical solution. As a result, a barrier metal layer to be coated on the surface of the wiring structure is formed stably.

To achieve the above object, according to one aspect of this invention, there is provided a method of forming a copper oxide film which comprises the step of forming a copper oxide film including an ammonia complex by causing a mixed solution of aqueous ammonia and aqueous hydrogen peroxide, which has been adjusted to have pH of 8 to 10 or pH of 9 to 10, to contact a surface of a copper film.

According to another aspect of this invention, there is provided a method of forming a copper oxide film which comprises the steps of forming a copper oxide film including an ammonia complex by causing a mixed solution of aqueous ammonia and aqueous hydrogen peroxide, which has been adjusted to have pH of 8 to 10 or pH of 9 to 10, to contact a surface of a copper film; and exposing the copper film having the copper oxide film formed on the surface thereof to a mixed solution of aqueous ammonia and aqueous hydrogen peroxide, which has been adjusted to have pH of 10 to 11.

According to a further aspect of this invention, there is provided a method of forming a copper oxide film which comprises the steps of forming an oxide film on a surface of a copper film using aqueous hydrogen peroxide; and forming a copper oxide film including an ammonia complex by placing the copper film having the oxide film formed thereon in a mixed solution of aqueous ammonia and aqueous hydrogen peroxide, which has been adjusted to have pH of 10 to 11.

In a case that only aqueous hydrogen peroxide or a mixed solution of aqueous hydrogen peroxide and aqueous ammonia, which has been adjusted to have pH of 8 to 10 or pH of 9 to 10, is first caused to contact a surface of a copper film to form a copper oxide film, and the copper film having copper oxide film is finally exposed to a mixed solution of aqueous ammonia and aqueous hydrogen peroxide, which has been adjusted to have pH of 10 to 11, pH may be varied intermittently in a multi-stage manner or continuously in the course of performing the method of forming a copper oxide film.

According to a still further aspect of this invention, there is provided a method of etching a copper film which comprises the steps of forming a copper oxide film including an ammonia complex on a surface of the copper film by using the copper oxide film forming method as recited in any one of the first to third aspects; and selectively removing the copper oxide film from the copper film. The copper oxide film may be removed with acid or alkaline.

According to a yet still further aspect of this invention, there is provided a method of fabricating a semiconductor device which comprises the steps of burying a copper film to be a wiring or a contact wiring in a wiring groove or a contact hole formed in a surface of an insulating film formed on a semiconductor substrate, or in both the wiring groove and the contact hole; forming a copper oxide film including an ammonia complex on a surface of the copper film by using the copper oxide film forming method as recited in any one of the first to third aspects; and selectively removing the copper oxide film from the copper film.

The surface of the copper film from which the copper oxide film has been removed may be etched deeper at a region closer to the wiring groove or the contact hole.

In the semiconductor device fabricating method, a barrier metal layer may be intervened between the wiring groove or the contact hole and the buried copper film or between the wiring groove and contact hole and the buried copper film.

The semiconductor device fabricating method may further comprise the step of forming a barrier metal layer on the copper film after removing the copper oxide film from the copper film.

In the semiconductor device fabricating method, the barrier metal layer intervened between the wiring groove or the contact hole and the buried copper film or between the wiring groove and contact hole and the buried copper film and the barrier metal layer formed on the copper film may be made of different materials.

The semiconductor device fabricating method may further comprise the step of placing the surface of the copper film from which the copper oxide film has been removed in aqueous ammonia.

In the semiconductor device fabricating method, with the semiconductor substrate being rotated at a speed of 1000 rpm to 1600 rpm, the surface of the copper film may be placed in the aqueous ammonia.

According to another aspect of this invention, there is provided a method of fabricating a semiconductor device, comprising the steps of: filling a wiring groove or a contact hole formed in an insulating film formed on a semiconductor substrate with wiring metal by depositing the wiring metal in the wiring groove or the contact hole; exposing the insulating film by polishing the wiring metal; cleaning the semiconductor substrate; and carrying out recessing etching on a surface of the wiring metal buried in the wiring groove or the contact hole, wherein chemical solutions used in at least two steps of the polishing step, the cleaning step and the recessing etching step have the same main component.

According to a further aspect of this invention, there is provided a method of fabricating a semiconductor device comprising the steps of: depositing metal or metal compound on a semiconductor substrate; and etching out an unnecessary portion of the metal or metal compound by etching; wherein the step of depositing metal or metal compound includes a plating step, component in plating solution used in the plating step forming salt or complex with a component to be plated is the same as a main component of chemical solution used in the etching-out step. In the semiconductor device fabrication method, the step of depositing the wiring metal may be a plating step and a main acidic component in plating solution used in the plating step may be the same as a main component of the chemical solution. The main oxidizing agent in the chemical solution may be hydrogen peroxide or ozone. The main acidic component in the chemical solution may be sulfuric acid or hydrocyanic acid. The semiconductor device fabrication method may further comprise a step of removing oxidizing agent contained in the chemical solution after the step of etching-out an unnecessary portion, a step of making metal ion concentration in the chemical solution approximately equal to metal ion concentration in the plating solution, and a step of using the chemical solution where the oxidizing agent has been removed as the plating solution.

Also, according to anther aspect, there is provided an apparatus of fabricating a semiconductor device used for the above method of fabricating a semiconductor device, comprising means for removing oxidizing agent contained in the chemical solution; means for making metal ion concentration in the chemical solution approximately equal to metal ion concentration in the plating solution; and means for using the chemical solution where the oxidizing agent has been removed as the plating solution.

According to another aspect, there is provided a semiconductor device comprising a semiconductor substrate; a metal film buried in a wiring groove, a contact hole, or the wiring groove and the contact hole formed on an insulating film formed on the semiconductor substrate; and a barrier metal layer formed on the metal film buried in the wiring groove, the contact hole, or the wiring groove and the contact hole so as to cover a surface of the metal film, wherein a surface of the metal film is etched deeper at a region closer to a side wall of the wiring groove or the contact hole. The metal film may be buried in the wiring groove or the contact hole via barrier metal. The barrier metal formed so as to cover the surface of the metal film may have a structure where it has been buried in the wiring groove or the contact hole. That is, the closer to the side wall of the wiring groove, the greater the etching amount of a surface of such a metal film as a copper film, and the surface of the metal film has a cross section with shoulders of the wiring dropped.

Therefore, the closer to a side wall of the wiring groove the barrier metal layer formed on the copper film is, the thicker the barrier metal layer becomes. This shape is frequently advantageous when this invention is worked out. For example, when the contact hole for forming a contact wiring is formed on the barrier metal layer, the etching area where the contact hole is to be formed partly cut into an inter-layer insulating film due to misalignment in some cases. When the inter-layer insulating film which covers the barrier metal layer of the under-layer wiring is etched under such a situation, etching of the inter-layer insulating film progresses because the etching rate of such an inter-layer insulating film as a silicon oxide film is greater than that of such a metal film as a copper film, so that portion is greatly etched. In the case of the shoulders of the wiring dropped, the diameter of a deep portion Is larger than that in a case of a flat surface. That is, the aspect ratio of this portion is low. Thus, it is easy to deposit a barrier metal layer and deposit a seed metal film as a copper film. Forming the contact hole is not limited to a case that a barrier metal layer is buried.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

This invention is adapted to, for example, a pillar process, a single damascene structure and a dual damascene structure in a multilayer wiring structure of a semiconductor device.

(1) Pillar Process

Figure 1A:
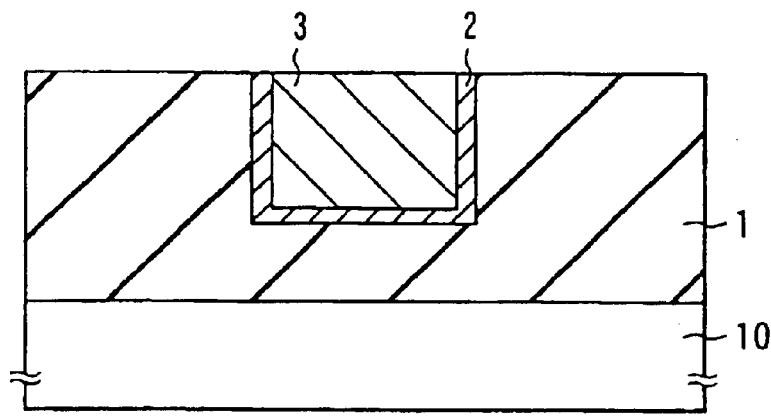
FIGS. 1A through 1D are cross-sectional views of a semiconductor substrate for explaining the fabrication steps for a semiconductor device according to this invention.
Figure 1B:
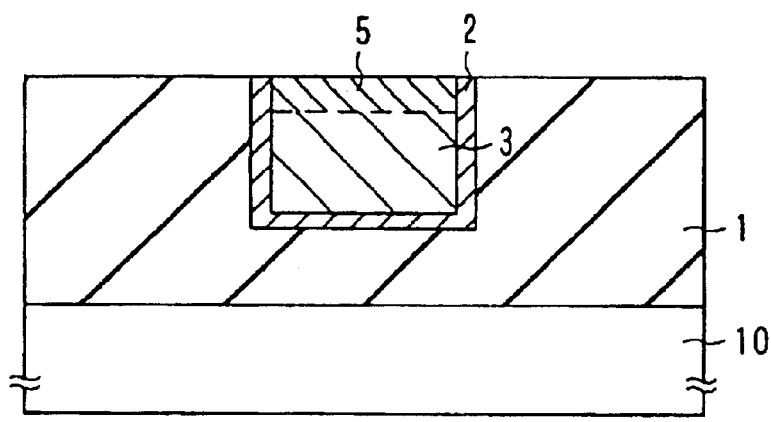
Figure 1C:
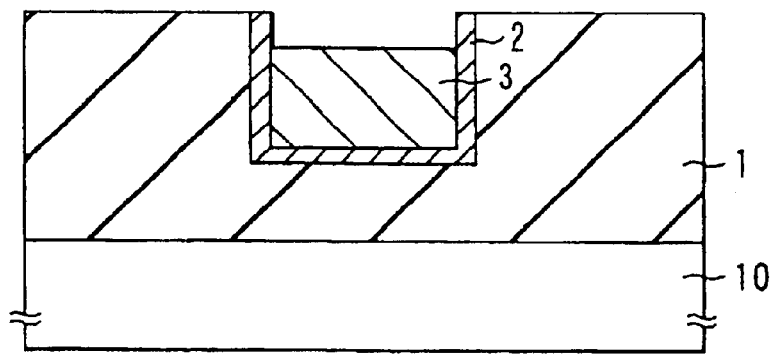
Figure 1D:
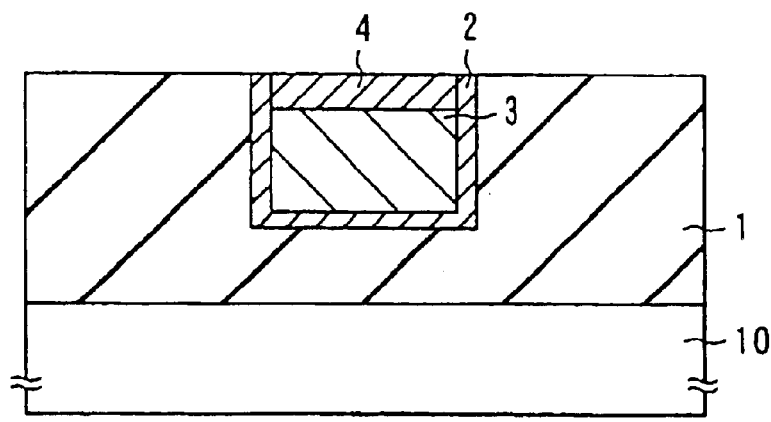
Figure 2A:
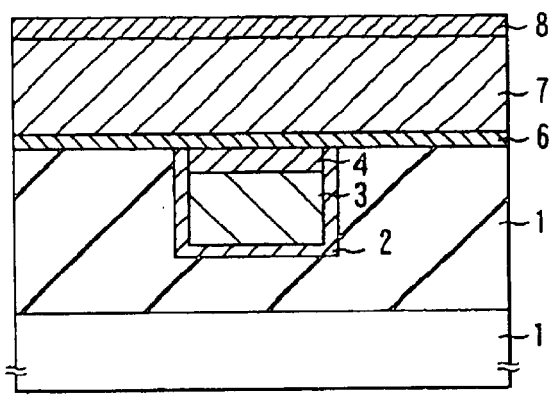
FIGS. 2A and 2B are cross-sectional views of the semiconductor substrate for explaining the fabrication steps for the semiconductor device according to this invention.
Figure 3A:
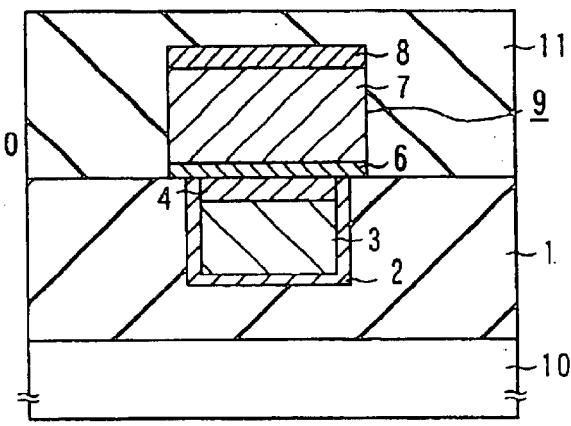
FIGS. 3A and 3B are cross-sectional views of the semiconductor substrate for explaining the fabrication steps for the semiconductor device according to this invention.
Figure 2B:
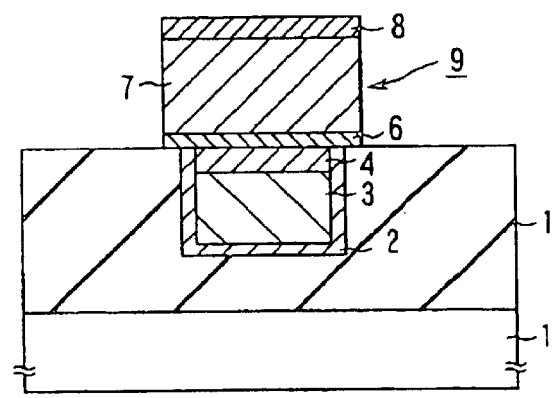
Figure 3B:
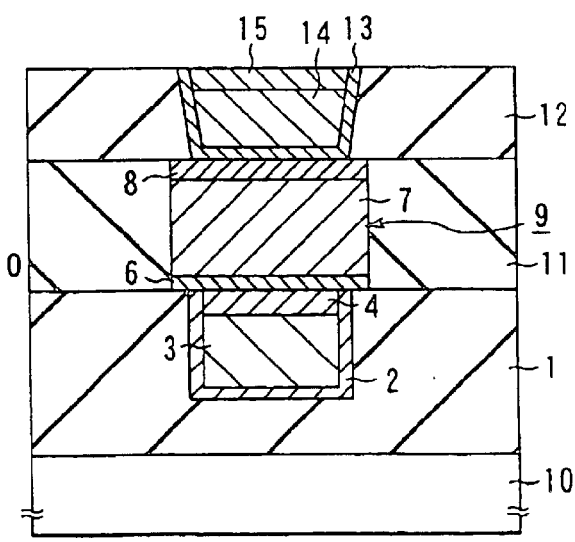

FIGS. 1A through 1D are cross-sectional views of a semiconductor substrate on which multilayer wirings are formed. A pillar wiring (contact wiring) which is formed by this process connects an under-lying wiring to an over-lying wiring. As shown in FIGS. 1A to 1D, the under-lying wiring is buried in an inter-layer insulating film 1. The inter-layer insulating film 1 is formed of silicon oxide on a semiconductor substrate 10 of silicon or the like where a semiconductor element (not shown) such as an integrated circuit is formed, and wiring grooves are formed in the surface of this inter-layer insulating film 1. A barrier metal layer 2 of a conductive nitride, such as TaN, WN or TiN, is formed on the side wall of each wiring groove and a copper film 3 or an alloy film essentially consisting of copper is buried in the region surrounded by the barrier metal layer 2. At this time, the barrier metal layer 2 is present only in the wiring groove, not on the surface of the inter-layer insulating film (FIG. 1A). The barrier metal layer may be formed over the wiring groove of the inter-layer insulating film 1 to the surface thereof. Next, according to the method of the present invention, a copper oxide film 5 is formed on the surface of the copper film 3 (FIG. 1B). The surface of the copper film 3 is set back from the surface of the inter-layer insulating film by etching out the oxide film 5 (FIG. 1C). Barrier metal is deposited on the upper portion of the wiring groove by sputtering, CVD or the like, and is then polished by CMP to bury a barrier metal layer 4 in the upper portion of the wiring groove (FIG. 1D). The material for the barrier metal layer 4 may be the same as that for the barrier metal layer 2 or those materials may differ from each other. Then, a barrier metal layer 6 of tungsten or the like, an aluminum film 7 and a conductive etching stopper 8, as needed, are deposited in order (FIG. 2A), and are then patterned to form a pillar wiring 9 (FIG. 2B). Then, an inter-layer insulating film 11 of silicon oxide is formed on the inter-layer insulating film 1 so as to cover the pillar wiring 9 (FIG. 3A). The surface of the inter-layer insulating film 11 is polished by CMP to expose the top surface of the pillar wiring 9. Next, an over-lying inter-layer insulating film 12 is deposited on the inter-layer insulating film 11, a groove which connects to the under-lying wiring 9 is formed in the interlayer insulating film 12, and an over-lying wiring is formed in this groove. The over-lying wiring comprises a barrier metal layer 13 formed in the wiring groove, a copper film 14 buried in the wiring groove and a barrier metal layer 15 which covers the surface of the copper film 14 (FIG. 3B). The pillar wiring 9 electrically connects the under-lying wiring to the over-lying wiring. In this pillar process, this invention is adapted to the formation of the barrier metal layers 4 and 15. That is, for example, in the method of forming a barrier metal layer 4 (FIGS. 1A to 1D), an exposed surface of the copper film 3 buried and formed in the insulating film 1 is oxidized to yield a copper oxide film 5 (FIG. 1B). Then, the copper oxide film 5 formed is etched out to yield an non-roughened (whitening-free) surface, on which a barrier metal layer 4 is then formed (FIG. 1C).

(2) Single Damascene

Figure 4:
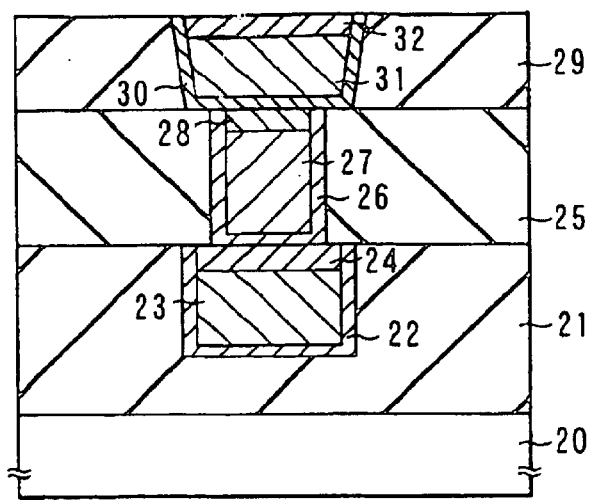
FIG. 4 is a cross-sectional view of a semiconductor substrate on which multilayer wirings according to this invention are formed.

FIG. 4 is a cross-sectional view of a semiconductor substrate on which multilayer wirings are formed. Inter-layer insulating films 21, 25 and 29 of silicon oxide or the like are sequentially formed on a semiconductor substrate 20. Formed in the inter-layer insulating films 21, 25 and 29 are wiring grooves and contact holes which communicate with one another and in which an under-lying wiring, a contact wiring and an over-lying wiring are respectively formed. To form each wiring, the wiring groove or contact hole is formed in the associated inter-layer insulating film, then a barrier metal layer is formed in the wiring groove and on the surface of the inter-layer insulating film, copper or an alloy essentially consisting of copper is deposited on the barrier metal layer and is polished by CMP or the like for surface planarization, thereby burying a copper film, covered with the barrier metal layer, in the wiring groove or the contact hole. Thereafter, according to the method of this invention, the surface of the copper film is oxidized and the copper oxide film formed by the oxidation is etched out to yield an non-roughened (whitening-free) surface, on which a barrier metal layer is then formed. That is, this invention is adapted to the formation of barrier metal layers 24, 28 and 32 in the multilayer wiring structure of a semiconductor device.

The under-lying wiring to be buried in the interlayer insulating film 21 comprises a barrier metal layer 22 formed on the side wall of the wiring groove, a copper film 23 covered with the barrier metal layer 22 and the barrier metal layer 24 which covers the surface of the copper film 23. The contact wiring which is electrically connected to the under-lying wiring and is buried in the inter-layer insulating film 25 comprises a barrier metal layer 26 formed on the side wall of the wiring groove, a copper film 27 buried in the wiring groove and covered with the barrier metal layer 26 and the barrier metal layer 28 which covers the surface of the copper film 27. The over-lying wiring which is electrically connected to the contact wiring and is buried in the inter-layer insulating film 29 comprises a barrier metal layer 30 formed on the side wall of the wiring groove, a copper film 31 buried in the wiring groove and covered with the barrier metal layer 30 and the barrier metal layer 32 which covers the surface of the copper film 31.

As the barrier metal layer 24 is formed on the surface of the copper film 23 of the under-layer wiring, diffusion of copper from an upper portion of the wiring can be suppressed. Also, as the surface of the copper film 23 is not roughened, the copper film is not affected by surface scattering or the like and increase in real resistance of the copper film is small. Also, as concentration of charges is suppressed after a contact is formed, an effect is also obtained that electro-migration is difficult to occur.

(3) Dual Damascene

Figure 5:
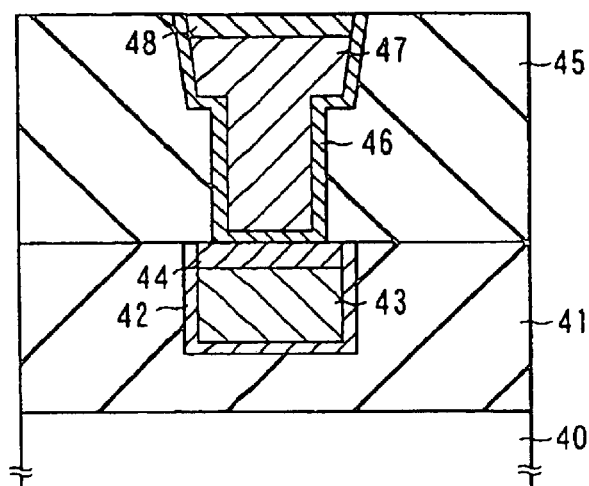
FIG. 5 is a cross-sectional view of a semiconductor substrate on which multilayer wirings according to this invention are formed.

FIG. 5 is a cross-sectional view of a semiconductor substrate on which multilayer wirings are formed. Inter-layer insulating films 41 and 45 of silicon oxide or the like are sequentially formed on a semiconductor substrate 40. Formed in the inter-layer insulating films 41 and 45 are wiring grooves and contact holes in which an under-lying wiring, a contact hole and an over-lying wiring are respectively formed. As in the case of single damascene, for each wiring, the wiring groove or contact hole is formed in the associated inter-layer insulating film, then a barrier metal layer is formed in the wiring groove and on the surface of the inter-layer insulating film, copper or an alloy essentially consisting of copper is deposited on the barrier metal layer and is polished by CMP or the like for surface planarization, thereby burying a copper film, covered with the barrier metal layer, in the wiring groove or the contact hole. Thereafter, according to the method of this invention, the surface of the copper film is oxidized and the copper oxide film formed by the oxidation is etched out to yield an non-roughened (whitening-free) surface, on which a barrier metal layer is then formed. That is, this invention is adapted to the formation of barrier metal layers 44 and 48 in the multilayer wiring structure of a semiconductor device.

The under-lying wiring to be buried in the interlayer insulating film 41 comprises a barrier metal layer 42 formed on the side wall of the wiring groove, a copper film 43 covered with the barrier metal layer 42 and the barrier metal layer 44 which covers the surface of the copper film 43. The over-lying wiring which is electrically connected to the under-lying wiring via a contact wiring and is buried in the interlayer insulating film 45 comprises a barrier metal layer 46 formed in the wiring groove and on the side wall of the contact hole which is formed continuous to this groove, a copper film 47 buried in the wiring groove and the contact hole and covered with the barrier metal layer 46, and the barrier metal layer 48 which covers the surface of the copper film 47. The adaptation of this invention to dual damascene can provide advantages similar to those of single damascene.

Examples of this invention as adapted to formation of a multilayer wiring structure of a semiconductor device will be discussed below.

To begin with, a first example will be discussed referring to FIGS. 6 through 8B.

The feature of this invention lies in its method of etching a copper film without roughening the copper surface. That is, an oxide film including an ammonia complex is formed on the surface of the copper film and is then etched out. Specifically, this method forms a relatively thick oxide film on the surface of copper without etching copper by adjusting a mixed solution of aqueous ammonia and aqueous hydrogen peroxide in such a way as to have pH of 8 to 10 or pH of 9 to 10, and then etches out this oxide film using an acid having a weak oxidizing property such as diluted hydrochloric acid or alkali such as diluted aqueous ammonia. As mentioned earlier, the ordinary mixed solution (SC1) of aqueous ammonia and aqueous hydrogen peroxide etches copper and has pH of about 10.5 to 11. The experiments conducted by the present inventor demonstrated such a property that with pH of 10 or less, an oxide film is formed on the surface of the copper film whereas with pH of greater than 10, copper is etched.

Figure 6:
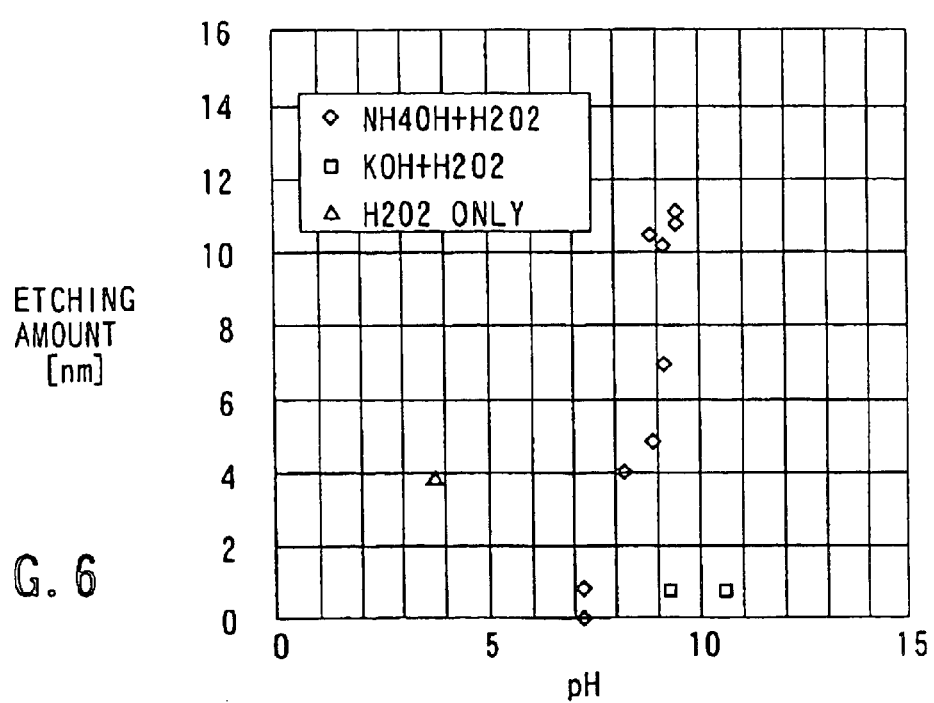
FIG. 6 is a characteristic diagram illustrating the amount of etched copper at the time of forming an oxide film on a copper film by dipping the copper film in a pH-adjusted mixed solution (SC1) for 1 minute and selectively etching the oxide film with diluted hydrochloric acid.
Figure 7A:
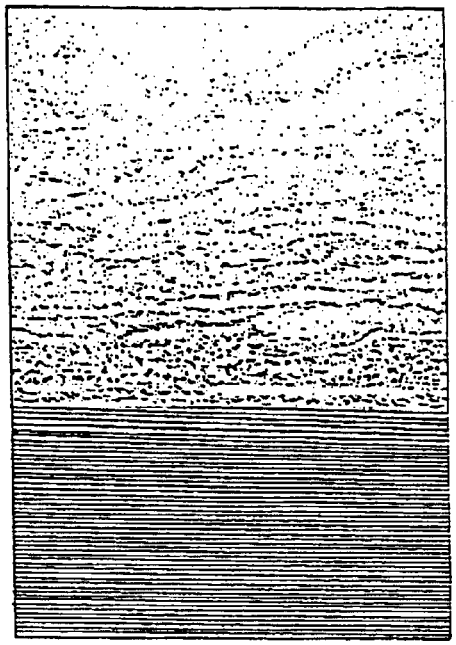
FIGS. 7A and 7B are diagrams respectively showing the SEM image of the surface of copper before copper is processed and the SEM image of the surface of copper after an oxide film is etched with hydrochloric acid after oxidation with a mixed solution of hydrochloric acid and aqueous hydrogen peroxide with pH of 9.5 for 1 minute.
Figure 7B:
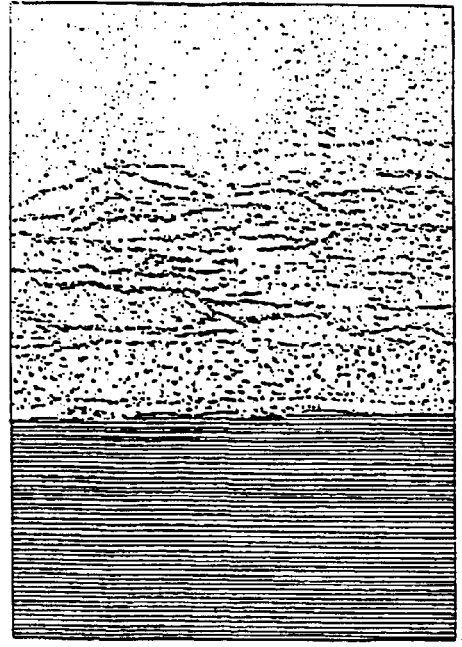
Figure 8A:
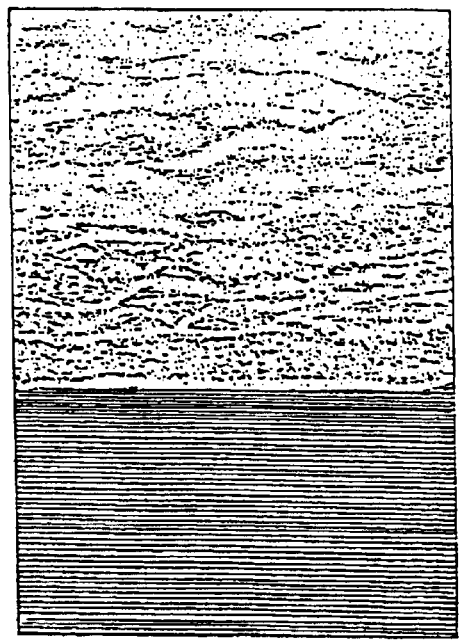
FIGS. 8A and 8B are diagrams respectively showing the SEM image of the surface of copper when copper is etched with a mixed solution of aqueous ammonia and aqueous hydrogen peroxide with pH of 10.2 and the SEM image of the surface of copper when copper is etched with a mixed solution of hydrochloric acid and aqueous hydrogen peroxide.
Figure 8B:
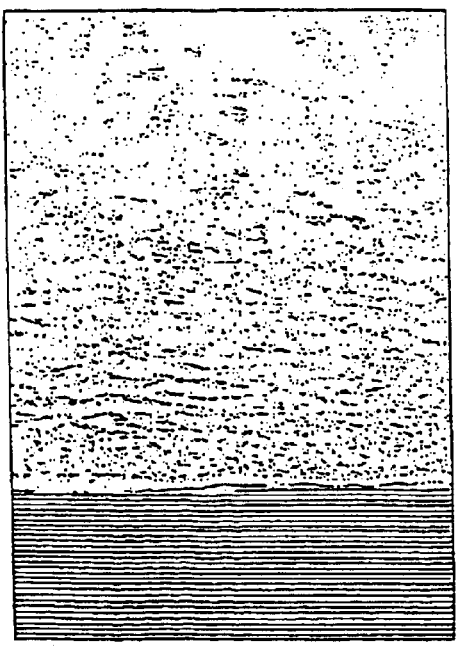

FIG. 6 shows the amount of etched copper at the time of forming an oxide film on a copper film by dipping the copper film in a pH-adjusted SC1 for 1 minute and selectively etching the oxide film with diluted hydrochloric acid. In FIG. 6, the vertical scale represents the etching amount (nm) and the horizontal scale represents pH. As shown in FIG. 6, although an oxide film was formed on the surface of copper even when the copper film was dipped in aqueous hydrogen peroxide with a concentration of about 18%, the etching amount was approximately 4 nm then. When aqueous ammonia was added for neutralization to pH=7, oxidation hardly occurred. As aqueous ammonia was further added and pH became greater than 8, the etching amount increased and became 11 to 12 nm at pH of about 10. When pH exceeded 10, deep bluish ammonia complex ions were formed and copper was dissolved. FIG. 7A shows the SEM image of the surface of copper before copper is processed, FIG. 7B shows the SEM image of the surface of copper after an oxide film is etched with hydrochloric acid after oxidation with a mixed solution of hydrochloric acid and aqueous hydrogen peroxide with pH of 9.5 for 1 minute, FIG. 8A shows the SEM image of the surface of copper which is etched with a mixed solution of aqueous ammonia and aqueous hydrogen peroxide with pH of 10.2, and FIG. 8B shows the SEM image of the surface of copper when copper is etched with a mixed solution (80° C.) of hydrochloric acid and aqueous hydrogen peroxide (for the purpose of reference). It is apparent from those diagrams that the use of a pH-adjusted mixed solution of aqueous ammonia and aqueous hydrogen peroxide can etch copper without roughening the copper surface.

To ensure accurate alignment at the time of implementing lithography, it is desirable that the etching thickness be 30 to 50 nm and the etching time be as short as possible. Even a treatment only with aqueous hydrogen peroxide which is considered as being capable of ensuring relatively thick oxidation takes about 12 to 13 minutes to etch copper by 50 nm. It is therefore preferable to carry out the treatment with a solution having pH of 8 to 10, desirably 9 to 10. Particularly, the use of a solution with pH of about 10 can achieve etching of 50 nm in approximately 4 minutes.

However, merely adjusting pH is not sufficient. Even when copper is dipped in a solution whose pH has been adjusted to 9 to 10.5 by mixing aqueous hydrogen peroxide and KOH or mixing hydrogen peroxide and choline, for example, copper is hardly oxidized as shown in FIG. 6. That is, it is important to use ammonia.

A second example will now be discussed.

As described in the foregoing description of the first example, the desirable etching amount of copper is 30 nm to 50 nm. Even if copper is dipped in a solution whose pH has been adjusted to 10, however, copper cannot be etched more than 12 nm in 1 minute. In the following description of the second example, an etching method which can avoid roughening of the copper surface while increasing the etching amount will be discussed. According to this method, a copper film is temporarily dipped in a solution containing only aqueous hydrogen peroxide or SC1 with pH of 8 to 10 to thereby form an oxide film on the copper film, and this copper film is then dipped in SC1 with pH of 10 to 11. Although the concentration of pH of 10 to 11 normally causes copper to be etched, the previous formation of an oxide film on the copper surface forms a thicker oxide film.

For example, as a copper film is dipped in a mixed solution, which contains aqueous hydrogen peroxide (35%), aqueous ammonia (35%) and pure water at a mixing ratio of =10:3:100 and thus has pH of 10, for 30 seconds, is then dipped in a solution whose composition ratio is changed to 1:1:10 (pH=10.5) for 1 minute and 30 seconds, thereby forming a thick oxide film on the copper film, and only the oxide film including an ammonia complex is etched with diluted hydrochloric acid, the etching amount of copper becomes 50 nm. This is about double the etching amount in a case where a copper film is dipped in the solution of the first example for a total of 2 minutes, and can apparently shorten the etching process.

A third example will be discussed with reference to FIGS. 9, 10A and 10B.

In this example, the actual etching target is the buried copper wiring shown in FIGS. 1A to 1D and the under-lying wiring shown in FIGS. 3A, 3B, 4 and 5. FIG. 9 is a cross-sectional view of a line and space wiring of 0.25 $\mu$m which is acquired by repeating, three times, a process of dipping a copper film in SC1 (aqueous hydrogen peroxide-:aqueous ammonia:pure water=10:3:100) whose pH has been adjusted to 10 for 1 minute and then removing the oxide film on the surface with diluted hydrochloric acid obtained by diluting 20% hydrochloric acid by a factor of 50 to thereby etch copper by about 35 to 40 nm. In FIG. 9, an inter-layer insulating film 51 is formed on a semiconductor substrate 50, and a wiring groove 54 having a barrier metal layer 52 deposited on its side wall is formed on this inter-layer insulating film 51. A copper film 53 is buried in this wiring groove 54. The copper wiring with the above structure is subjected to the above-described oxide-film formation and etching to yield a non-roughened surface. Thereafter, TaN or WN is deposited as second barrier metal on the non-roughened surface by sputtering or CVD method, followed by CMP to thereby form a barrier metal layer 55.

Figure 9:
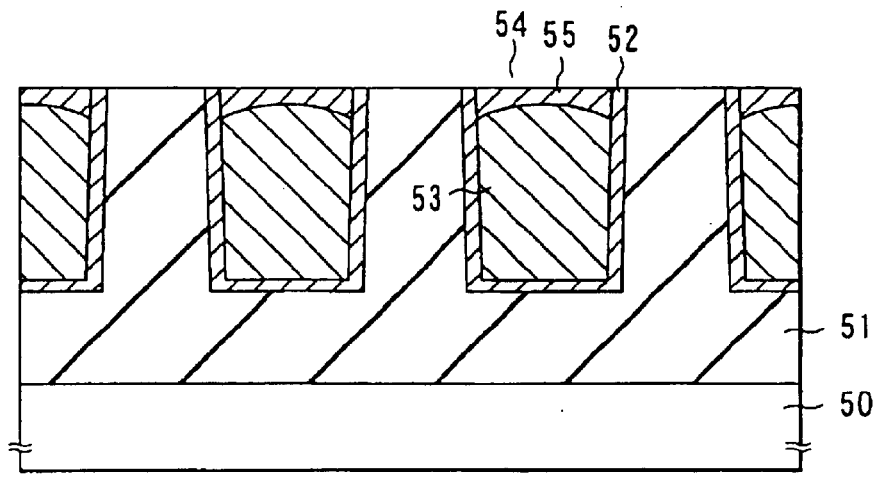
FIG. 9 is a cross-sectional view of a semiconductor substrate for explaining the surface shape of a copper wiring in a wiring groove formed in an interlayer insulating film according to this invention.

As shown in FIG. 9, the closer to the wiring groove 54 the non-roughened surface of the copper film 53 obtained by etching is, the greater the etching amount. This non-roughened surface of the copper film 53 has a cross section with shoulders of the wiring dropped. Therefore, the closer to the wiring groove 54 the barrier metal layer 55 formed on the copper film 53 is, the thicker the layer 55 becomes. This shape is frequently advantageous when this invention is worked out.

Figure 10A:
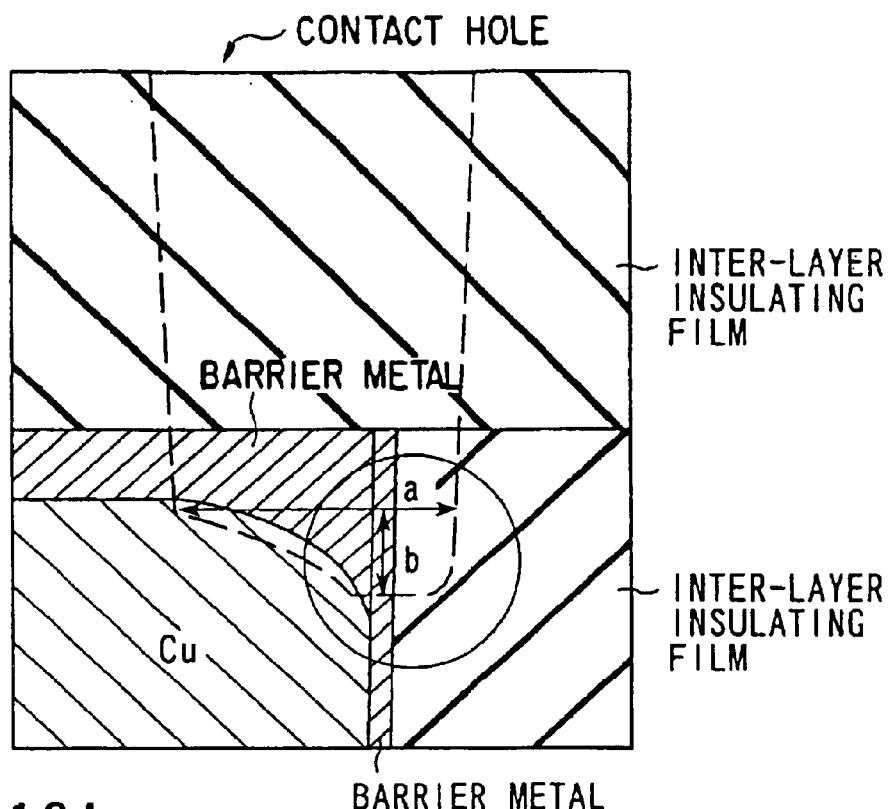
FIGS. 10A and 10B are exemplary cross-sectional views of a semiconductor substrate for explaining the advantage of this invention.
Figure 10B:
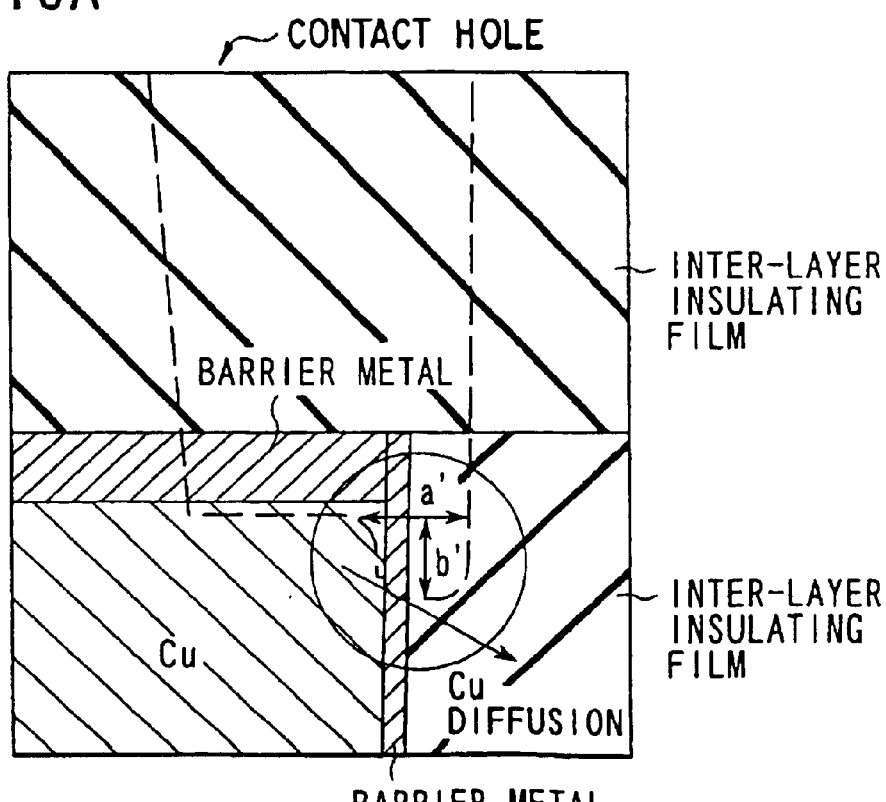

FIGS. 10A and 10B are exemplary cross-sectional views of a semiconductor substrate for explaining the advantage of this invention. FIG. 10A shows the copper wiring in FIG. 9 with its shoulders dropped, and FIG. 10B shows the copper wiring having its surface flattened up to the end thereof and formed with a nearly uniform barrier metal layer which covers the copper wiring. To form a contact wiring which connects the over-lying wiring to the under-lying wiring, a contact hole (via) should be formed in the inter-layer insulating film deposited on the under-lying wiring. As shown in FIGS. 10A and 10B, when the contact hole for forming a contact wiring is formed on the barrier metal layer which is formed on the upper surface of the copper wiring, the etching area where the contact hole is to be formed partly cuts into the inter-layer insulating film due to misalignment in some cases. When the inter-layer insulating film which covers the barrier metal layer of the under-lying wiring is etched under such a situation, etching of the inter-layer insulating film progresses because the etching rate of the inter-layer insulating film (silicon oxide film) is greater than that of the copper metal layer, so that portion is greatly etched to form the contact holes as shown by broken line in FIGS. 10A and 10B.

In FIG. 10A, the diameter of the deep portion is "a" and the depth is "b". In FIG. 10B, the diameter of the deep portion is "a'" and the depth is "b'". As the etching rate is determined by the material, b'=b. In the case of the shoulders of the wiring dropped as in FIG. 10A, the diameter of the deep portion is larger than that in a case of the flat surface in FIG. 10B (a>a'). That is, the deep portion in FIG. 10B is shaped like a pocket so that the aspect ratio of this portion (b'/a') is significantly greater than the aspect ratio of the deep portion (b/a) in FIG. 10A. In a case of deposing a barrier metal layer in the contact hole in FIG. 10B and using plating to bury copper in the contact hole, therefore, it is difficult to form a seed copper film, whereas it is easy to deposit a barrier metal layer in the contact hole in FIG. 10A to thereby form a seed copper film.

Of course, this is not limited to copper, but it is applicable to a metal film of any wiring or contact in a semiconductor device. It is applicable to a case that a barrier layer is formed on the entire surface of a metal film or a case that an inter-layer insulating film is directly deposited on the metal film instead of burying barrier metal in a metal film.

A fourth example will now be discussed.

Etching of approximately 50 nm is possible by dipping the copper wiring in SC1(aqueous hydrogen peroxide:aqueous ammonia:pure water=10:3:100) whose pH has been adjusted to 10 for 30 seconds, then dipping the copper wiring in SC1 with pH=10.5 (mixing ratio of 1:1:10) for 1 minute and 30 seconds, thereby oxidizing the surface of the copper wiring, and then removing the oxide film on the surface with diluted aqueous ammonia obtained by diluting 35% aqueous ammonia by a factor of 3/10. Thereafter, TaN or WN is deposited as second barrier metal on the overlying layer by sputtering, followed by CMP to thereby yield the wiring structure as shown in FIG. 9 as per the third example.

Figure 11:
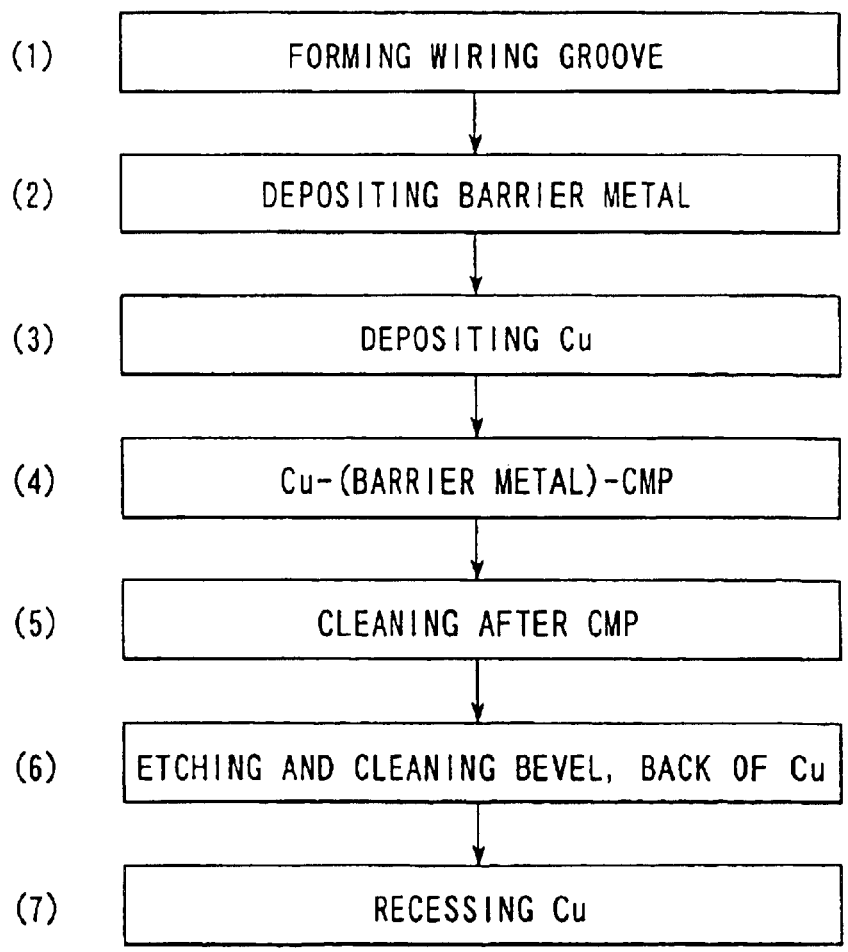
FIG. 11 is a process diagram for explaining the steps of forming copper wirings.

A fifth example will be discussed below referring to FIG. 11.

In the following description of the fifth example, steps of forming a copper wiring using this invention will be explained. FIG. 11 is a process diagram for explaining the steps of forming copper wirings. As illustrated, the copper wiring forming process first (1) forms a wiring groove in the inter-layer insulating film. Next, (2) a barrier metal layer formed of a conductive nitride such as TaN, WN or TiN is deposited on the bottom and the side walls of the wiring groove by sputtering, CVD or the like. Then, (3) copper (Cu) is so deposited as to be buried in the wiring groove by sputtering, plating, CVD or the like. Next, (4) Cu alone or Cu and the barrier metal layer are polished by CMP to form a buried Cu wiring in the inter-layer insulating film. Then, (5) the wafer after CMP is cleaned. Thereafter, (6) etching out the Cu film deposited on the bevel portion and the back portion of a wafer and cleaning those portions are performed as needed. Finally, (7) the Cu recessing process of this invention is carried out.

As the chemical solution in this invention can permit polishing of the Cu surface while protecting this surface by forming an oxide film thereon, the solution can be used as slurry for Cu-CMP. Although after normal CMP, physical cleaning with roll sponge or pencil sponge is performed by the same manufacturing equipment or another equipment, it is well known that the use of an alkaline chemical solution in this cleaning demonstrates a great effect of cleaning particles. As the chemical solution of this invention is alkaline, it is effective to use this solution in cleaning to remove the residual of ground particles (alumina or silica).

Further, the use of sputtering or CVD causes Cu to be deposited on the bevel portion of a wafer or the back thereof. When deposition is carried out by plating method using Cu deposited by sputtering or CVD as a seed, the Cu deposited on the bevel portion is utilized as an electrode, however the Cu on the bevel portion becomes unnecessary after plating. The bevel or the back of the wafer is where various systems contact for transfer or chuck purposes at the time of fabricating a semiconductor device. When there is Cu contamination in such a portion, other wafers may be contaminated through the manufacturing equipment. It is therefore necessary to carry out etching and cleaning of Cu adhered to the bevel and back of a wafer after Cu-CMP. Although this process may be executed prior to CMP, it is desirably carried out after CMP because the bevel and back of the wafer are likely to be polluted with Cu again at the time of CMP. To simultaneously etch and clean the back and bevel of a wafer, it is desirable to perform the treatment by spraying a chemical solution capable of dissolving Cu, a mixed solution of hydrochloric acid and aqueous hydrogen peroxide, acid such as nitric acid, thermal concentrated sulfuric acid or phosphoric acid from the back while rotating the wafer using a rotary type single wafer system. Etching in this manner however may oxidize Cu in the device portion on the surface only in the vicinity of the wafer edges after treatment. This seems to have occurred by the acceleration of oxidation by gases, such as HCl, NOx and SOx vaporized from the chemical solution or generated during etching, remaining on the Cu surface.

To remove such an oxide film, a treatment with acid having a weak oxidation property, such as hydrochloric acid or diluted sulfuric acid is performed, which may make the Cu film near the wafer edges oxidized by the treatment thinner. One way to avoid this problem is to provide a nozzle which sprays a chemical solution only on the bevel portion while letting pure water flow from the surface side while rotating the wafer, process the bevel portion using this nozzle and at the same time process the back by spraying the chemical solution also from the back. This scheme requires a special nozzle, making the structure of the manufacturing equipment complicated and resulting in an increased cost from the viewpoint of hardware, and requires a step of letting pure water flow from the surface, disabling the collection and recirculation of the chemical solution as an etching solution and increasing the amount of the chemical solution in use, from the viewpoint of processes.

If a thick oxide film is previously formed on the Cu surface after CMP by the method of this invention, however, the aforementioned problems do not arise even in a case of the treatment only with a chemical solution from the back. In a case of forming a Cu wiring, therefore, the same chemical solution can be used in the entire process from the Cu-CMP step ((4)) in FIG. 11 to the Cu recessing step ((7)) so that the whole process can be carried out in the same equipment.

Figure 14:
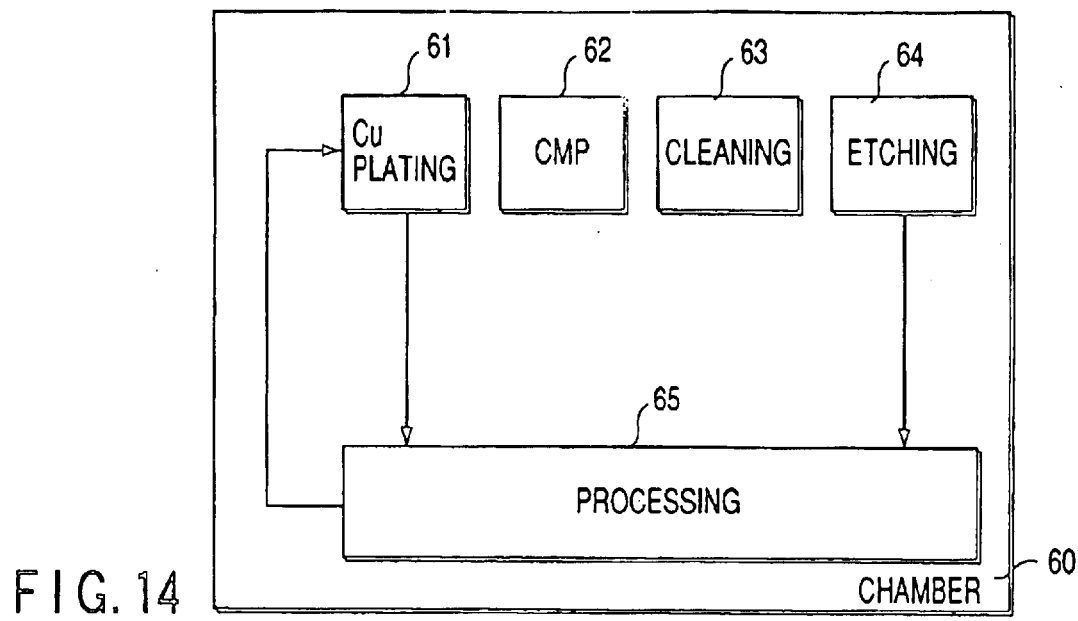
FIG. 14 is a diagrammatical view of a semiconductor manufacturing apparatus for performing a manufacturing method of a semiconductor device according to the present invention.

The use of the same chemical solution has an advantage of simplifying the structure at the time of constructing the manufacturing equipment, and the permission of the sequence of processes in the same equipment eliminates the need for drying the target step by step, thereby improving the throughput. For example, FIG. 14 is a diagrammatical view of a semiconductor fabricating apparatus where a semiconductor device is fabricated in the above same chamber. Forming steps of a copper wiring will be explained using the process shown in FIG. 11. First, (1) a wiring groove is formed in an inter-layer insulating film. Then, (2) a barrier metal layer is deposited on a bottom surface and a side surface of the wiring groove. Next, (3) Cu is deposited so as to be buried in the wiring groove by plating. This step is carried out in a Cu plating chamber 61. (4) Cu alone or Cu and the barrier metal layer are polished by CMP to form a buried Cu wiring in the inter-layer insulating film. This step is carried out in a CMP chamber 62. Next, (5) the wafer after CMP is cleaned in a post-CMP cleaning chamber 63. Thereafter, (6) Cu on a bevel/back of the wafer is etched and the wafer is cleaned. This step is performed in an etching chamber 64. Then, (7) a recessing process of Cu is also performed in the etching chamber 64. The bevel/back etching process and the recessing etching process may be respectively performed in chambers different from each other, but it is preferable to perform them sequentially in the same chamber. These Cu plating chamber 61, CMP chamber 62, post-CMP cleaning chamber 63, etching chamber 64 and processing chamber 65 are disposed in one apparatus 60 so that the copper wiring forming step may be performed.

In the apparatus 60 shown in FIG. 14, the exhaust solutions from the Cu plating chamber 61 and the etching chamber 64 of the respective chambers are collected in the processing chamber 65 where the oxidizing agent such as hydrogen peroxide or ozone is removed from the collected solution, and the concentration of copper or sulfuric acid is adjusted. The solution thus adjusted is returned to the plating chamber 61, and it is reused as the plating solution.

Figure 15:
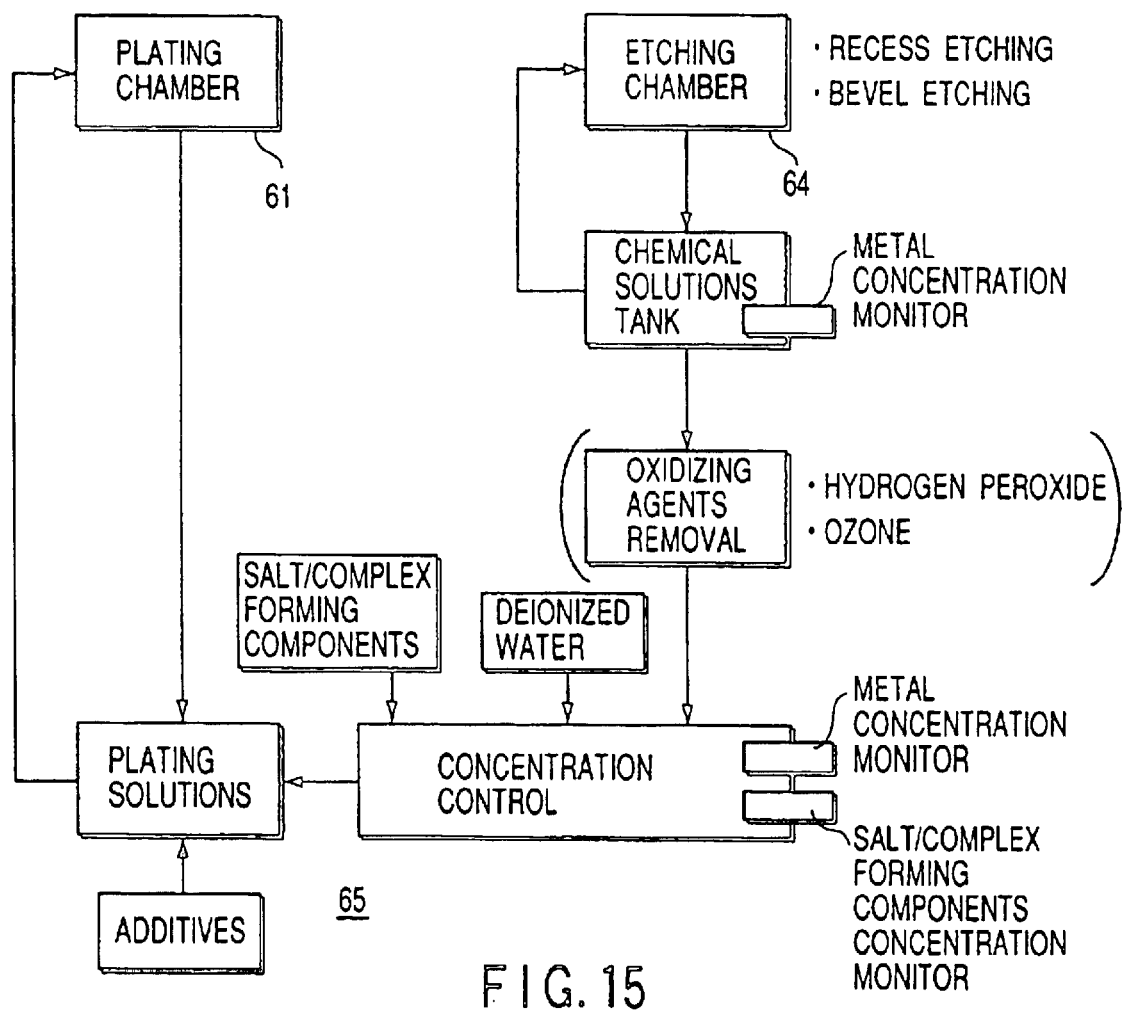
FIG. 15 is a diagrammatical view of a semiconductor manufacturing apparatus for performing a manufacturing method of a semiconductor device according to the present invention, and is used to explain the recycle in the apparatus.

As shown in a diagrammatical view of a semiconductor fabricating apparatus of FIG. 15, the semiconductor fabrication apparatus shown in FIG. 14 is provided with the plating chamber 61, the etching chamber 64 and the processing chamber 65. The processing chamber 65 comprises a concentration adjusting section and a plating solution section for adjusting plating solution, where the used plating solution from the plating chamber 61 and the exhaust solution from the etching chamber 64 is adjusted while supplying pure water, components forming salt or complex or the like to the concentration adjusting section and the adjusted solution is supplied to the plating solution section to form plating solution. The plating solution thus adjusted is supplied to the plating chamber 61. The semiconductor fabricating apparatus may be structured such that, when the amount of the exhaust solution from the etching chamber 64 is small relative to that of the used plating solution from the plating chamber 61, only the exhaust solution from the etching chamber 64 is adjusted while the used plating solution is directly recovered in the plating solution section.

In a case that the plating process is assembled in the same apparatus, it is preferable that the solution which has been applied for etching copper or copper oxide has the same components as the plating solution as the solution is sulfuric acid when the plating solution used is aqueous solution of copper sulfate or it is hydrocyanic acid when the plating solution is aqueous solution of copper cyanide. This is because, as the components of the etching chemical solution and the components contained in plating solution which has been used are approximately equal to each other, there is an advantage that they can be exhausted and treated simultaneously. Further, a process having a very high efficiency in use of copper can be made up by carrying out plating again using the chemical solution which has been used for etching.

However, it is difficult to etch metal copper by using only acid having a weak acidic property such as dilute sulfuric acid or hydrocyanic acid. For this reason, it is preferable to use hydrogen peroxide or ozone which becomes water or oxygen after reaction or dissolution as oxidizing agent for imparting an oxidizing property to the acid having a weak oxidizing property. For example, when aqueous solution with 10% copper sulfate is used as the plating solution, copper or copper oxide is etched with 10% sulfuric acid (+hydrogen peroxide or ozone), and copper concentration in the etching solution is used via recovery and circulation until it exceeds 10% or so while being monitored in an in-line manner regarding ion concentration, weight, absorbance or the like. Of course, sulfuric acid having a concentration different from that of the plating solution may be used as the etching solution, and the circulation is not required to carry out necessarily. As it is difficult to condense only copper concentration, it is preferable that the copper concentration is made equal to or more than the concentration of sulfuric acid. Finally, targeted aqueous solution with 10% copper sulfate is prepared by completely decomposing hydrogen peroxide or ozone by an active carbon filter, a UV lamp irradiation or the like, and adding sulfuric acid or pure water to the etching solution or condensing the etching solution by processing using thermal treatment or a semipermeable membrane such as a reverse osmosis membrane while monitoring copper concentration or sulfuric acid concentration. Thereafter, the aqueous solution is added with additives required for plating to be used for plating. At this time, simultaneously therewith, concentration adjustment may be carried out on the plating solution which has been used, and the solution which has been concentration-adjusted may be added a little by a little. Of course, any other devices or mechanism than the above mentioned ones can be used as the concentration monitor, the oxidizing agent removing mechanism and the chemical solution condensing mechanism.

A process or apparatus where the solution which has been applied to the etching process is recycled as the plating solution can be applied not only to copper but also to any material including at least metal such as Au, Ag, Ti or the like.

A sixth example will now be discussed referring to FIG. 12.

Figure 12:
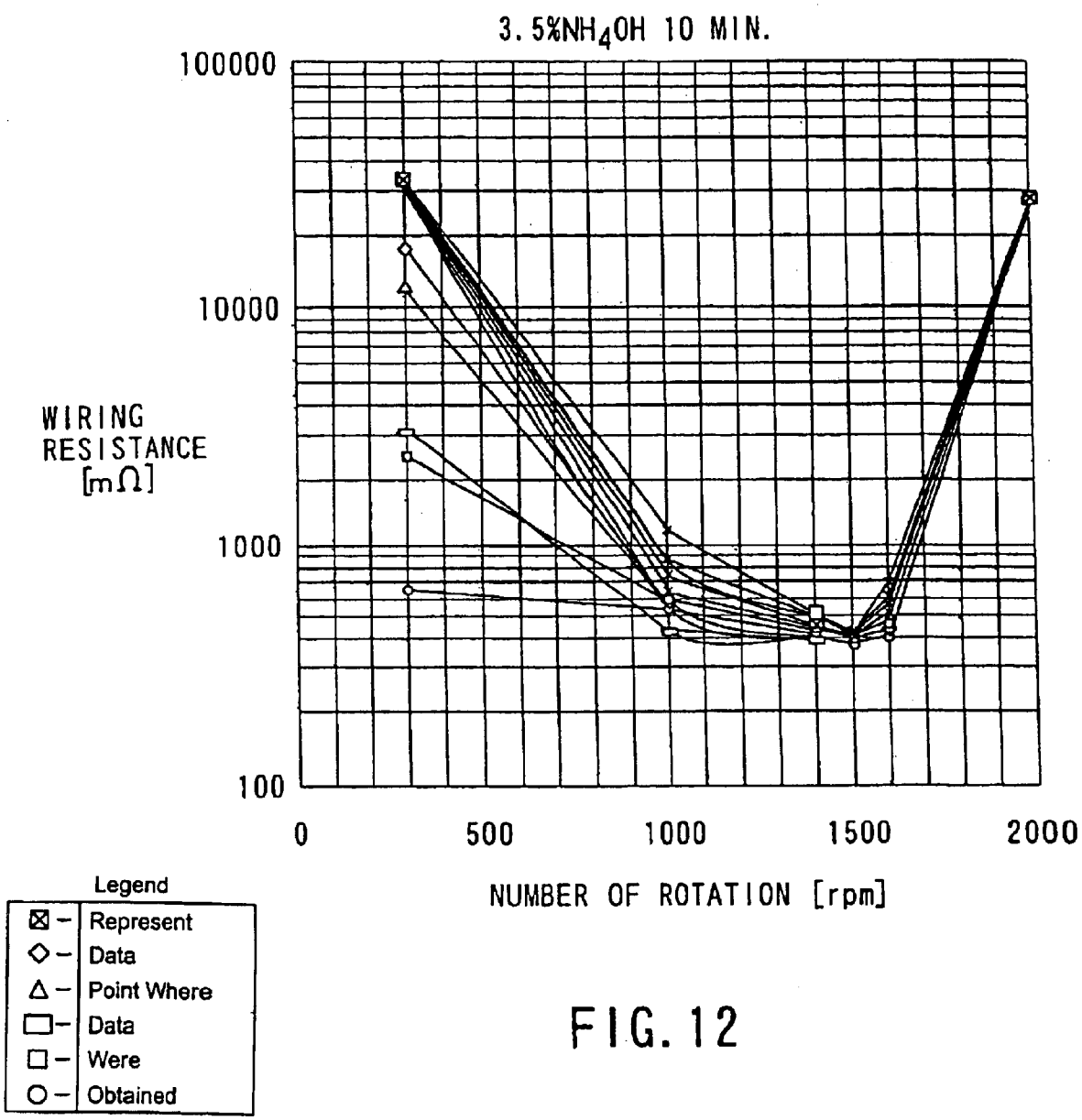
FIG. 12 is a characteristic diagram for explaining the dependency of the wiring resistance of a wafer on the number of rotations of the wafer in an ammonia treatment at the time of recessing copper.
Figure 13A:
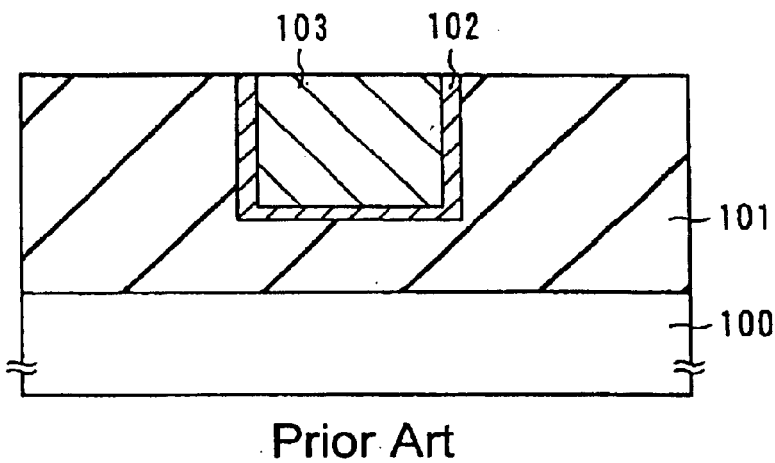
FIGS. 13A through 13C are cross-sectional views showing a conventional buried wiring structure.
Figure 13B:
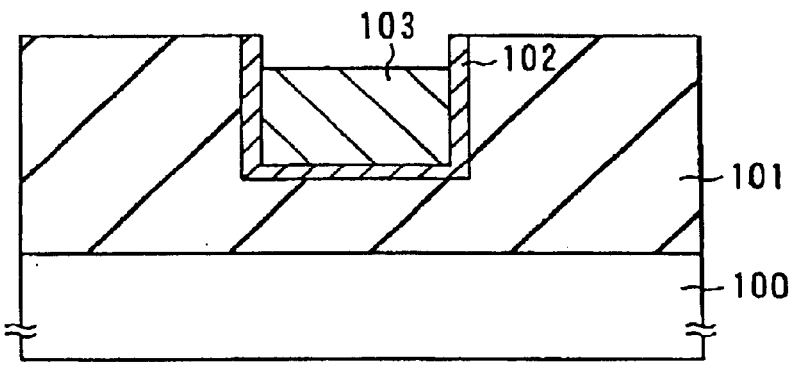
Figure 13C:
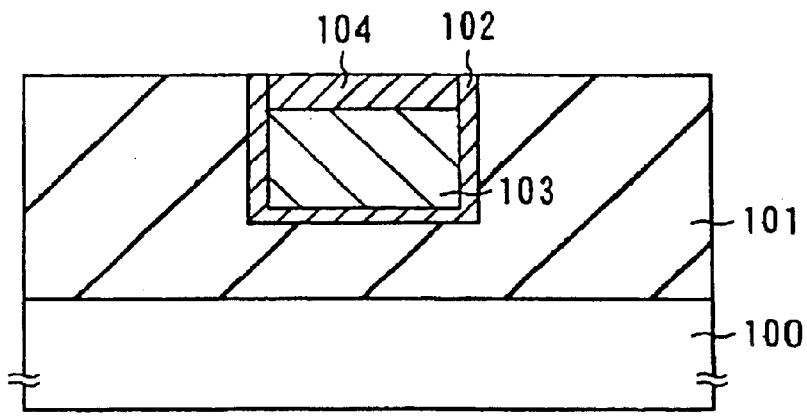

FIG. 12 is a characteristic diagram for explaining the dependency of the wiring resistance of a wafer on the number of rotations of the wafer in an ammonia treatment at the time of recessing Cu. In this example, Cu recess of about 50 nm is possible by using a rotary type single wafer system in the Cu recessing process and performing (1) a treatment with $NH_4OH:H_2O_2:DIW$ (30:100:1000) for 60 seconds at 1000 rpm, (2) a treatment with $NH_4OH:H_2O_2:DIW$ (100:100:1000) for 60 seconds at 1000 rpm and (3) HCl:DIW (30:1000) for 5 seconds at 1000 rpm. But, the Cu surface finished with the treatment with hydrochloric acid has fast natural oxidation. When the Cu surface is oxidized, the effective Cu that can be used as wiring is reduced and the cross-sectional area of the wiring is decreased, thus increasing the wiring resistance. If a Cu oxide film is formed between the Cu surface and the upper barrier metal, the contact resistance to upper via may increase or the capacitance provided may delay the processing speed in terms of device. In terms of processes, it is necessary to deposit the upper barrier metal quickly by managing the time after the recessing process at the time of forming the upper barrier metal or there is a possibility that separation may occur at the time of CMP.

It was found out that executing the treatment with aqueous ammonia after the hydrochloric acidic treatment suppresses natural oxidation. But, aqueous ammonia etches Cu so that excess processing may roughen the copper surface. It was found out that the use of a rotary type single wafer system in etching Cu with aqueous ammonia demonstrates the etching characteristic depending on the number of rotations of a wafer. The graph in FIG. 12 is obtained by plotting the wiring resistance (mΩ) after etching of Cu with 3.5% aqueous ammonia for 10 minutes after Cu wirings (wiring resistance of about 342 mΩ) having a width of 0.35 μm are formed in 19 chips on an 8-inch silicon wafer, using the number of rotations of the wafer as a parameter. As Cu of the wiring is etched to reduce its cross-sectional area, the resistance increases. $3 \times 10^4$ mΩ indicates that Cu has been etched completely.

If the uniformity of etching within the wafer surface is poor, a variation in resistance increase becomes large, whereas this variation is small for a good uniformity. The variation becomes smaller at 1000 rpm or higher, takes the minimum value near 1475 rpm, and is about the same at 1600 rpm as that at 1000 rpm. In the case of etching at 2000 rpm, Cu with a thickness of 400 nm has been etched completely. As we want to perform a treatment only on the surface, it is not desirable to perform the treatment at such a high etching rate. Because the etching rate is expected to rise as the number of rotations is increased from 1600 rpm, it is better to set the speed to 1600 rpm or lower. It is thus desirable to perform an ammonia treatment for suppression of oxidation within a range of 1000 rpm to 1600 rpm.

As the ammonia treatment was actually carried out after the recessing process, the Cu surface after it was placed in the clean room environment for 24 hours after the treatment held about the same level of metallic gloss as that before the treatment as opposed to the Cu surface finished with a hydrochloric acidic treatment. The processing conditions were (1) $NH_4OH:H_2O_2:DIW$ (30:100:1000) for 60 seconds at 1000 rpm, (2) a treatment with $NH_4OH:H_2O_2:DIW$ (100:100:1000) for 60 seconds at 1000 rpm, (3) NCl:DIW (30:1000) for 5 seconds at 1000 rpm and (4) $NH_4OH:DIW$ (30:1000) for 5 seconds at 1475 rpm.

According to this invention, the above-described structures can permit copper to be etched without roughening the copper surface which has conventionally been difficult to achieve, can ensure quick oxidation and etching with a safe and inexpensive chemical solution. As a result, a barrier metal layer to be coated on the surface of the wiring structure is formed stably.

It should be apparent to those skilled in the art that the present invention may be embodied in many other specific forms without departing from the spirit or scope of the invention. Therefore, the present examples and embodiment are to be considered as illustrative and not restrictive and the invention is not to be limited to the details given herein, but may be modified within the scope of the appended claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a semiconductor device comprising:

plating copper or a copper compound on a semiconductor substrate; and etching an unnecessary portion of the copper or copper compound;

wherein a main acid component in a plating solution used in the plating forms a salt or a complex with a component to be plated and is the same as a main acid component of a chemical solution used in the etching, said main acid components in the plating solution and the chemical solution are sulfuric acid, and a main oxidizing agent in the chemical solution is hydrogen peroxide or ozone.

2. A method of fabricating a semiconductor device comprising:

plating copper or a copper compound on a semiconductor substrate; and etching an unnecessary portion of the cooper or copper compound;

wherein a main acid component in a plating solution used in the plating forms a salt or a complex with a component to be plated and is the same as a main acid component of a chemical solution used in the etching, removing an oxidizing agent contained in chemical solution after said etching making a copper ion concentration in the chemical solution substantially equal to a copper ion concentration in said plating solution;

using the chemical solution where said oxidizing agent has been removed as the plating solution; and said main acid components in the plating solution and the chemical solution are sulfuric acid.

3. A method of fabricating a semiconductor device comprising:

plating copper or a copper compound on a semiconductor substrate; and etching an unnecessary portion of the copper or copper compound, wherein a chemical solution used in the etching contains sulfuric acid as a main acid component when a plating solution used in the plating contains a solution of copper sulfate as a main acid component, and a main oxidizing agent in the chemical solution is hydrogen peroxide or ozone.

4. A method of fabricating a semiconductor device comprising:

plating copper or a copper compound on a semiconductor substrate; and etching an unnecessary portion of the copper or copper compound;

wherein a chemical solution used in the etching contains sulfuric acid as a main acid component when a plating solution used in the plating contains a solution of copper sulfate as a main acid component;

removing an oxidizing agent contained in the chemical solution after said etching;

making a copper ion concentration in the chemical solution substantially equal to a copper ion concentration in said plating solution; and using the chemical solution where said oxidizing agent has been removed as the plating solution.

5. A method of fabricating a semiconductor device comprising:

plating copper or a copper compound on a semiconductor substrate; and etching an unnecessary portion of the copper or copper compound;

wherein a main acid component in a plating solution used in the plating forms a salt or a complex with a component to be plated and is the same as a main acid component of a chemical solution used in the etching, and said main acid components in the plating solution and the chemical solution are hydrocyanic acid.

6. The method according to claim 5, wherein a main oxidizing agent in the chemical solution is hydrogen peroxide or ozone.

7. The method according to claim 5, further comprising removing an oxidizing agent contained in the chemical solution after said etching, making a copper ion concentration in the chemical solution substantially equal to a copper ion concentration in said plating solution, and using the chemical solution where said oxidizing agent has been removed as the plating solution.

8. The method according to claim 5, wherein the unnecessary portion of the copper or copper compound comprises a portion plated on a bevel portion of the semiconductor substrate.

9. A method of fabricating a semiconductor device comprising:

plating copper or a copper compound on a semiconductor substrate; and etching an unnecessary portion of the copper or copper compound, wherein a chemical solution used in the etching contains hydrocyanic acid as a main acid component when a plating solution used in the plating contains a solution of copper cyanide as a main acid component.

10. The method according to claim 9, wherein a main oxidizing agent in the chemical solution is hydrogen peroxide or ozone.

11. The method according to claim 9, further comprising removing the oxidizing agent contained in the chemical solution after said etching, making a copper ion concentration in the chemical solution substantially equal to a copper ion concentration in said plating solution, and using the chemical solution where said oxidizing agent has been removed as the plating solution.

12. The method according to claim 9, wherein the unnecessary portion of the copper or copper compound comprises a portion plated on a bevel portion of the semiconductor substrate.

13. A method of fabricating a semiconductor device comprising:

plating silver or a silver compound on a semiconductor substrate; and etching an unnecessary portion of the silver or silver compound;

wherein a main acid component in a plating solution used in the plating forms a salt or a complex with a component to be plated and is the same as a main acid component of a chemical solution used in the etching, and said main acid components in the plating solution and the chemical solution are hydrocyanic acid.

14. The method according to claim 13, wherein a main oxidizing agent in the chemical solution is hydrogen peroxide or ozone.

15. The method according to claim 13, further comprising removing an oxidizing agent contained in the chemical solution after said etching, making a silver ion concentration in the chemical solution substantially equal to a silver ion concentration in said plating solution, and using the chemical solution where said oxidizing agent has been removed as the plating solution.

16. The method according to claim 13, wherein the unnecessary portion of the silver or silver compound comprises a portion plated on a bevel portion of the semiconductor substrate.

17. A method of fabricating a semiconductor device comprising:

plating silver or a silver compound on a semiconductor substrate; and etching an unnecessary portion of the silver or silver compound, wherein a chemical solution used in the etching contains hydrocyanic acid as a main acid component when a plating solution used in the plating contains a solution of silver cyanide as a main acid component.

18. The method according to claim 17, wherein a main oxidizing agent in the chemical solution is hydrogen peroxide or ozone.

19. The method according to claim 17, further comprising removing an oxidizing agent contained in the chemical solution after said etching, making a silver ion concentration in the chemical solution substantially equal to a silver ion concentration in said plating solution, and using the chemical solution where said oxidizing agent has been removed as the plating solution.

20. The method according to claim 17, wherein the unnecessary portion of the silver or silver compound comprises a portion plated on a bevel portion of the semiconductor substrate.

* * * * *

UNITED STATES PATENT AND TRADEMARK OFFICE
CERTIFICATE OF CORRECTION

PATENT NO. : 6,818,556 B2
DATED : November 16, 2004
INVENTOR(S) : Uozumi

It is certified that error appears in the above-identified patent and that said Letters Patent is hereby corrected as shown below:

Column 17,
Line 11, change "cooper" to -- copper --.
Line 19, change "said etching" to -- said etching; --.

Signed and Sealed this

Twenty-second Day of March, 2005

JON W. DUDAS
*Director of the United States Patent and Trademark Office*